US011728205B2

(12) United States Patent
Dogome (10) Patent No.: US 11,728,205 B2
(45) Date of Patent: Aug. 15, 2023

(54) DEVICE FOR TRANSFERRING SUBSTRATE, SYSTEM FOR PROCESSING SUBSTRATE, AND METHOD OF PROCESSING SUBSTRATE

(71) Applicant: TOKYO ELECTRON LIMITED, Tokyo (JP)

(72) Inventor: Masahiro Dogome, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/404,671

(22) Filed: Aug. 17, 2021

(65) Prior Publication Data

US 2022/0059395 A1 Feb. 24, 2022

(30) Foreign Application Priority Data

Aug. 21, 2020 (JP) .................. 2020-140298

(51) Int. Cl.
| | | |
|---|---|---|
| *H01L 21/687* | (2006.01) | |
| *B25J 18/02* | (2006.01) | |
| *B25J 11/00* | (2006.01) | |
| *B25J 19/00* | (2006.01) | |
| *B25J 9/00* | (2006.01) | |
| *H01L 21/67* | (2006.01) | |

(52) U.S. Cl.
CPC ...... *H01L 21/68792* (2013.01); *B25J 9/0009* (2013.01); *B25J 11/0095* (2013.01); *B25J 18/025* (2013.01); *B25J 19/0079* (2013.01); *H01L 21/67017* (2013.01); *H01L 21/68707* (2013.01)

(58) Field of Classification Search
CPC .. B25J 11/0095; B25J 19/0079; B25J 18/025; H01L 21/6879
See application file for complete search history.

(56) References Cited

U.S. PATENT DOCUMENTS

| | | | |
|---|---|---|---|
| 6,688,189 B2* | 2/2004 | Hashimoto | ............ B25J 18/025 414/935 |
| 2013/0323002 A1* | 12/2013 | Furuichi | ........... H01L 21/67742 414/744.5 |
| 2020/0306991 A1* | 10/2020 | Kanazawa | ........... B25J 19/0079 |

FOREIGN PATENT DOCUMENTS

| | | |
|---|---|---|
| JP | H9-29682 A | 2/1997 |
| JP | 2002-338042 A | 11/2002 |
| KR | 20-2010-0006715 U | 7/2010 |

\* cited by examiner

*Primary Examiner* — Jake Cook
(74) *Attorney, Agent, or Firm* — Fenwick & West LLP (57) ABSTRACT

There is provided a device for transferring a substrate under air pressure. The device comprises a base part, a transfer arm part configured to transfer a substrate, a telescopic shaft part which is provided between the base part and the transfer arm part, and divided into a plurality of division shaft parts having a tubular shape, an annular channel which is provided in a circumference of a surface of a division shaft parts, and an exhaust channel which is connected to the annular channel so as to exhaust the gas flowing into the annular channel.

15 Claims, 12 Drawing Sheets

DEVICE FOR TRANSFERRING SUBSTRATE, SYSTEM FOR PROCESSING SUBSTRATE, AND METHOD OF PROCESSING SUBSTRATE

CROSS-REFERENCE TO RELATED APPLICATIONS

This application claims priority to Japanese Patent Application No. 2020-140298, filed on Aug. 21, 2020, the entire contents of which are incorporated herein by reference.

TECHNICAL FIELD

The present disclosure relates to a device for transferring a substrate, a system for processing a substrate, and a method of processing a substrate.

BACKGROUND

In a manufacturing process of flat panels of semiconductor devices or liquid crystal display devices, substrates such as semiconductor wafers (hereinafter, referred to as "wafers") or glass substrates are carried into a carry-in port of a substrate processing system in a state of being accommodated in a substrate transfer container. The substrates are taken out from the substrate transfer container by a substrate transfer device provided in the substrate system, are transferred to each processing device, and are subjected to predetermined processes.

Here, Japanese Patent Application Publication No. 2002-338042 discloses technology in which a generation of particles is suppressed by a down flow ventilation of clean air from the outside to the inside of a base part in which a vertical shaft is provided for elevating an arm part of a transfer robot configured to transfer the substrate.

SUMMARY

The present disclosure is directed to a method for suppressing the outflow/inflow of pollutants from the inside to the outside and vice-versa of a substrate transfer device, which is provided with a telescopic shaft part for elevating a transfer arm.

In accordance with an aspect of the present disclosure, there is provided a device for transferring a substrate under air pressure. The device comprises a base part, a transfer arm part configured to transfer a substrate, a telescopic shaft part which is provided between the base part and the transfer arm part, and divided into a plurality of division shaft parts having a tubular shape, wherein the division shaft parts have a telescopic structure that is extendable and contractible, an annular channel which is provided in a circumference of a surface of a division shaft parts, wherein the surface of the division shaft part faces a surface of other division shaft part due to the telescopic structure, the annular channel has exhaust holes, and the annular channel exhausts a gas flowing into a gap formed in the circumferential direction between the facing surfaces, and an exhaust channel which is connected to the annular channel so as to exhaust the gas flowing into the annular channel, wherein a shape of the exhaust channel is changed according to upward or downward movement of the division shaft part due to extension or contraction of the telescopic shaft part.

DETAILED DESCRIPTION

Hereinafter, a configuration of a wafer processing system 100 including a wafer transfer device 10 will be described with reference to the accompanying drawings as embodiments of a device for transferring a substrate and a system for processing a substrate including the same according to the present disclosure.

Figure 1:
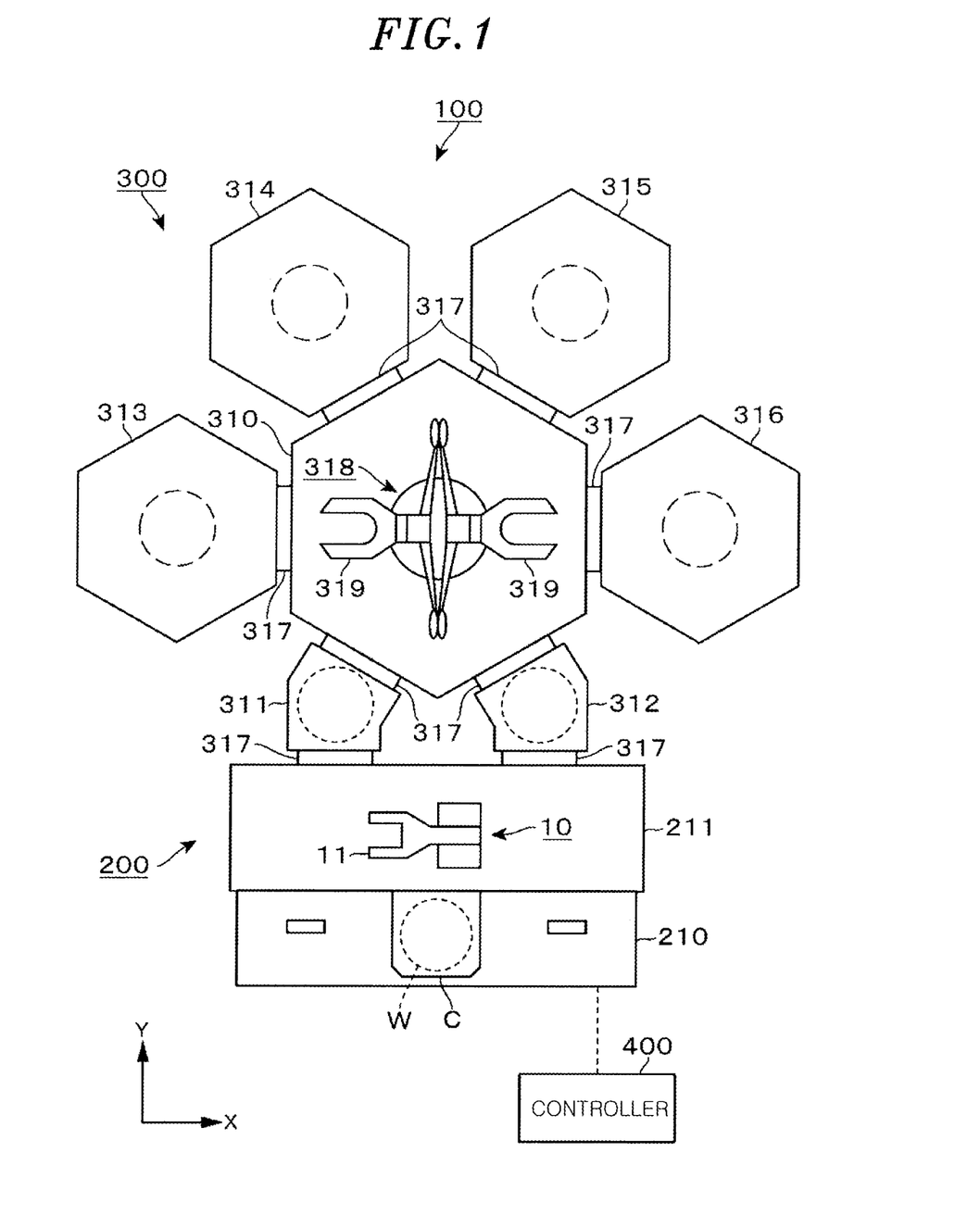
FIG. 1 is a plan view of a wafer processing system including a wafer transfer device of the present disclosure.

FIG. 1 is a schematic plan view illustrating an outline of the configuration of the wafer processing system 100. The wafer processing system 100 of the present example has a configuration in which a cassette station 200 and a processing station 300 are integrally connected, wherein the cassette station 200 loads/unloads wafers W, i.e., substrates, in a cassette unit, and the processing station 300 includes a plurality of processing devices for processing the wafers W sheet by sheet.

The cassette station 200 includes a cassette mounting unit 210 and an atmospheric transfer chamber 211. A plurality of cassettes C, for example, three cassettes C, which are substrate transfer containers capable of accommodating the plurality of wafers W, may be mounted side by side on the cassette mounting unit 210 in an-X direction as shown in FIG. 1. The atmospheric transfer chamber 211 is disposed adjacent to a front side of the cassette mounting unit 210 (in a Y-direction as shown in FIG. 1). The atmospheric transfer chamber 211 is provided with the wafer transfer device 10 which is a device for transferring the wafer W under air pressure.

Figure 2:
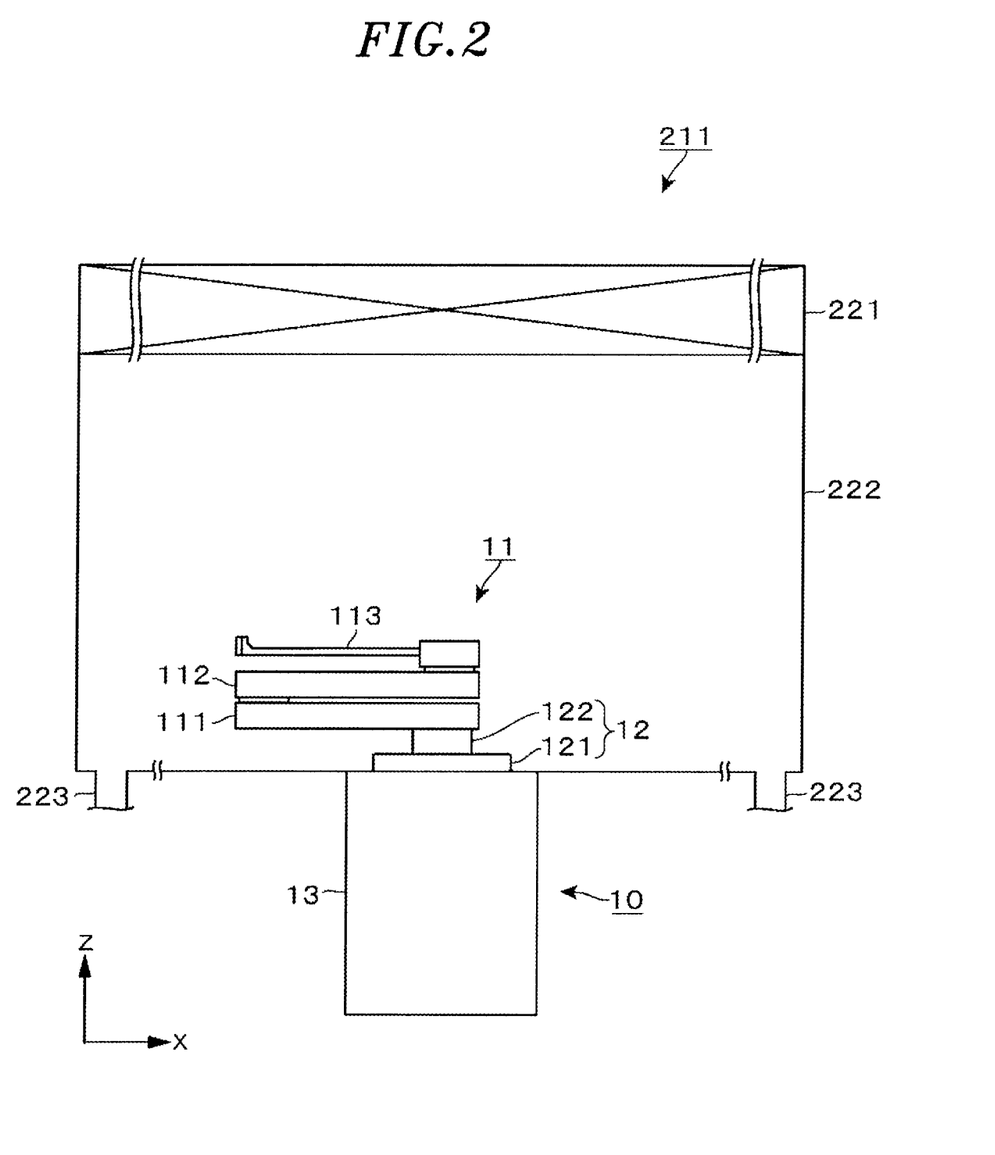
FIG. 2 is a longitudinal cross-sectional side view of an atmospheric transfer chamber provided with the wafer transfer device.

As schematically shown in FIG. 2, the atmospheric transfer chamber 211 has a housing-like space capable of accommodating the wafer transfer device 10. A clean air down-flows from a fan filter unit (FFU) 221 provided on a ceiling surface of the atmospheric transfer chamber 211 to a down-flow exhaust passage 223 provided on a floor surface thereof, and; therefor, a mini-environment 222 is formed.

In addition, the inlet and outlet ports in the atmospheric transfer chamber 211, through which the wafer W is transferred between the cassette C and load lock chambers 311 and 312 to be described below, are not drawn in FIG. 2. Furthermore, in FIGS. 7A, 7B, 9A, 9B, and 10, the illustration of the FFU 221 and the downflow exhaust passage 223 in the atmospheric transfer chamber 211 will also be omitted.

The wafer transfer device 10 in the atmospheric transfer chamber 211 includes an articulated transfer arm part 11 that is rotatable, horizontally extendable and contractible. The transfer arm part 11 may transfer the wafer W between the cassette C mounted on the cassette mounting unit 210 and the load lock chambers 311 and 312 of the processing station 300 to be described below.

A vacuum transfer chamber 310 is provided at a center of the processing station 300. The pressure in the vacuum transfer chamber 310 is adjusted to a vacuum. When viewed in a plan view, the vacuum transfer chamber 310 is formed, for example, in substantially a hexagonal shape, and the load lock chambers 311 and 312 and, for example, four processing devices 313, 314, 315, and 316 are connectively provided around the vacuum transfer chamber 310.

The load lock chambers 311 and 312 are disposed between the vacuum transfer chamber 310 and the atmospheric transfer chamber 211 and connect the atmospheric transfer chamber 211 to the vacuum transfer chamber 310. The load lock chambers 311 and 312 include mounting portions (not shown) for the wafer W, and the inside thereof may be converted between an air pressure atmosphere and vacuum atmosphere.

Gate valves 317 are provided for airtightly sealing between the atmospheric transfer chamber 211 and the load lock chambers 311 and 312, between the vacuum transfer chamber 310 and the load lock chambers 311 and 312, and between the processing devices 313 to 316. In addition, the gate valves 317 can be opened and closed.

The vacuum transfer chamber 310 is provided with a vacuum transfer device 318 which is a device for transferring the wafer W in a vacuum atmosphere. The vacuum transfer device 318 has, for example, two transfer arms 319. Each transfer arm 319 may be provided to be rotatable and be extendable and contractible and may transfer the wafer W to the load lock chambers 311 and 312 around the vacuum transfer chamber 310 and the processing devices 313 to 316.

The processing devices 313 to 316 perform predetermined processes such as an etching process using plasma and a film forming process based on a preset processing procedure.

The wafer processing system 100 includes a controller 400 which controls the wafer transfer device 10, the vacuum transfer device 318, each of the processing devices 313 to 316, or the like. The controller 400 is provided as a computer including a central processing unit (CPU) and a storage unit and controls each unit of the wafer processing system 100. A program including a group of operations (instructions) for controlling the operation of the wafer transfer device 10 and the like is recorded in the storage unit. The program is stored on a storage medium such as a hard disk, a compact disk, a magnet optical disk, or a memory card, and the storage medium is installed on a computer.

Figure 3:
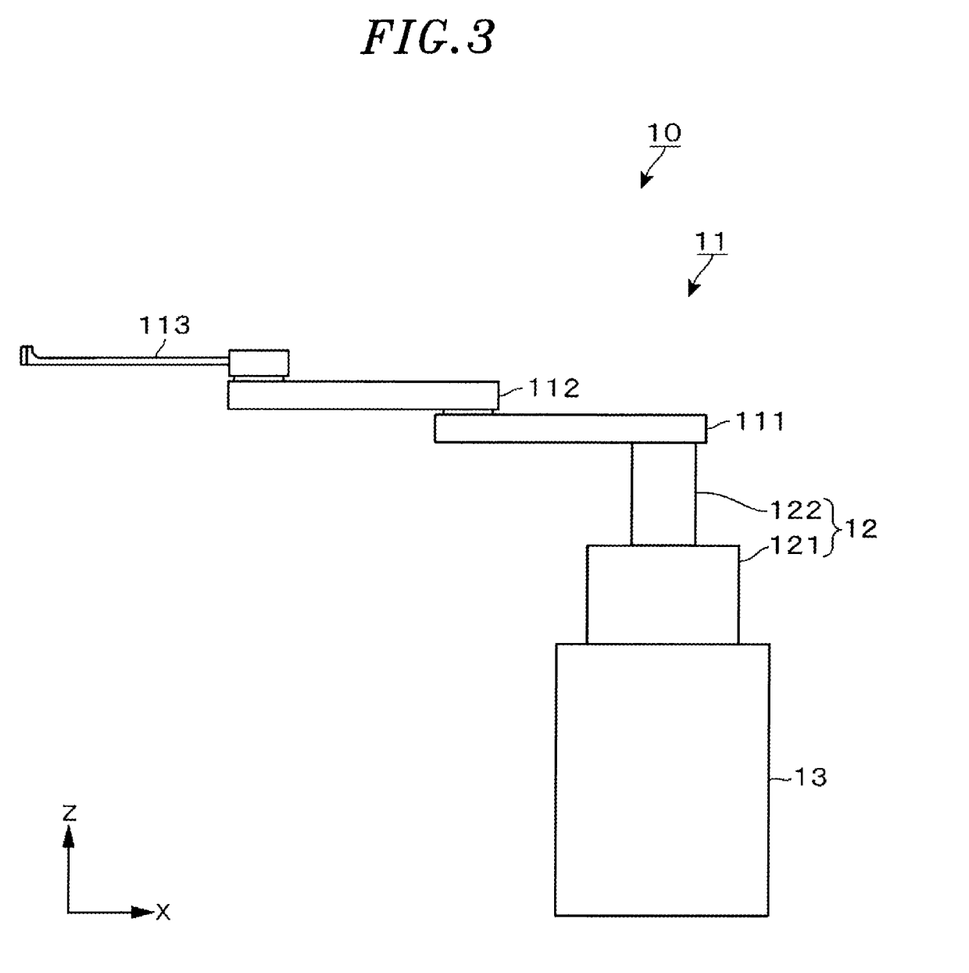
FIG. 3 is a side view of the wafer transfer device.

Next, a configuration of the wafer transfer device 10 provided in the atmospheric transfer chamber 211 will be described. FIG. 3 is a schematic side view illustrating the configuration of the wafer transfer device 10 when the transfer arm part 11 and a telescopic shaft part 12 thereof are extended.

As shown in FIGS. 2 and 3, the wafer transfer device 10 includes a base part 13 and the transfer arm part 11. The base part 13 and the transfer arm part 11 are connected to each other through the telescopic shaft part 12 which is provided to be vertically extendable and contractible.

The base part 13 is provided to be horizontally movable by a driving part (not shown).

The transfer arm part 11 is provided to be rotatable and horizontally extendable and contractible and includes a first arm 111 and a second arm 112. A base-side portion of the first arm 111 is connected to the telescopic shaft part 12 so as to rotate on a vertical axis. The second arm 112 is connected to a leading end of the first arm 111 so as to rotate on a vertical axis and includes a fork 113 which holds the wafer W while the wafer W is being transferred. The fork 113 extends horizontally from the second arm 112, and a leading end thereof is formed in a Y-shape divided into two portions (also see a plan view of the transfer arm part 11 of FIG. 1).

The telescopic shaft part 12 provided between the base part 13 and the transfer arm part 11 is divided into a plurality of division shaft portions having a tubular shape (in the present example, two division shaft portions: first division shaft portion 121 and second division shaft portion 122). In addition, the second division shaft portion 122 may be accommodated in the first division shaft portion 121. In this way, by forming a telescopic structure in which the second division shaft portion 122 is accommodated in the first division shaft portion 121, the telescopic shaft part 12 having an extendable and contractible telescopic structure is formed.

Furthermore, the base part 13 may accommodate almost the entire telescopic shaft part 12 in a contacted state therein. Due to such a configuration, the telescopic shaft part 12 is in a contacted state in which the second division shaft portion 122 is accommodated in the first division shaft portion 121 and the entire telescopic shaft part 12 is accommodated in the base part 13 (see a longitudinal cross-sectional side view of FIG. 7A).

Figure 4:
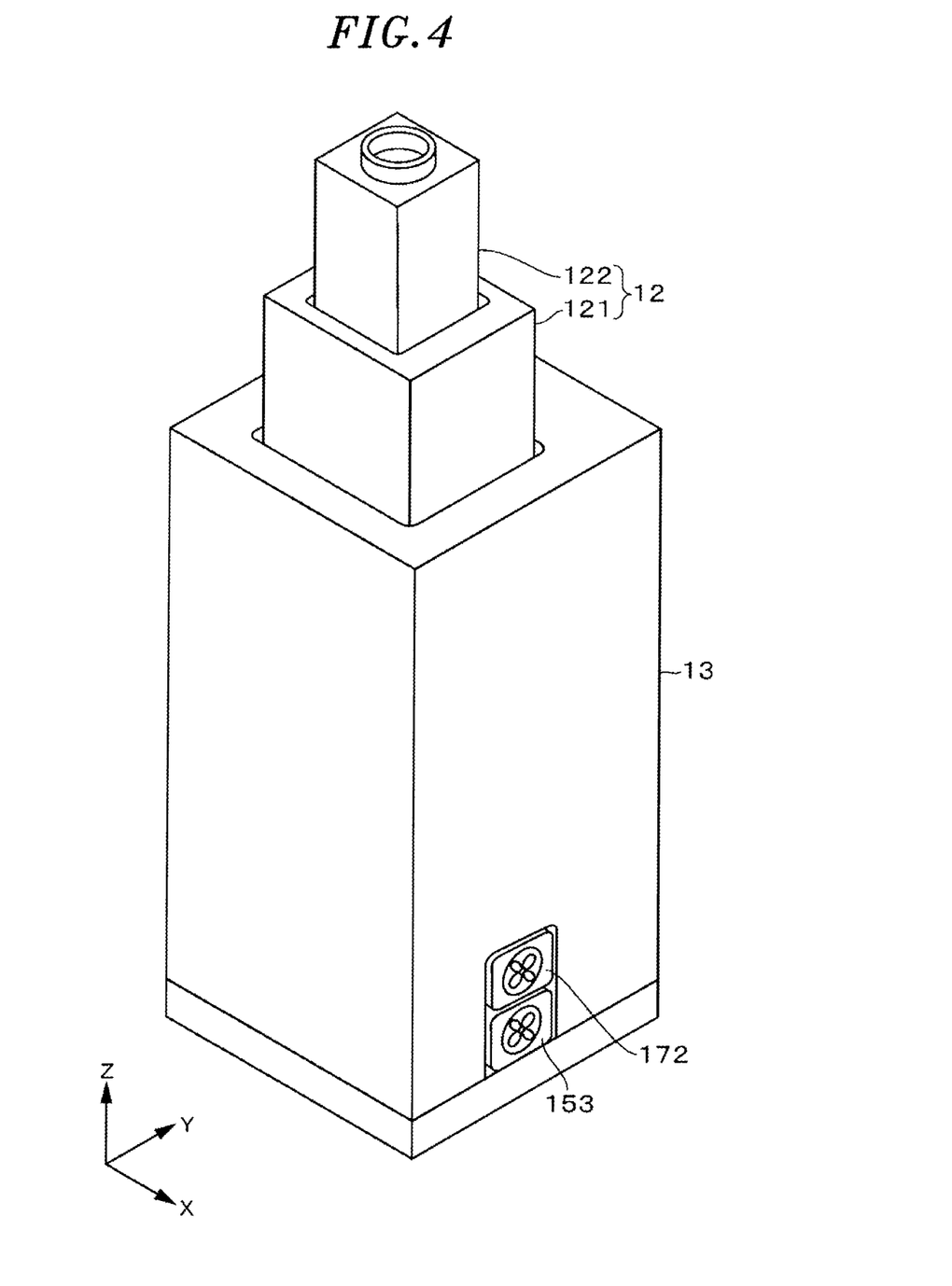
FIG. 4 is an external perspective view illustrating a configuration of a lower side of the wafer transfer device.
Figure 7A:
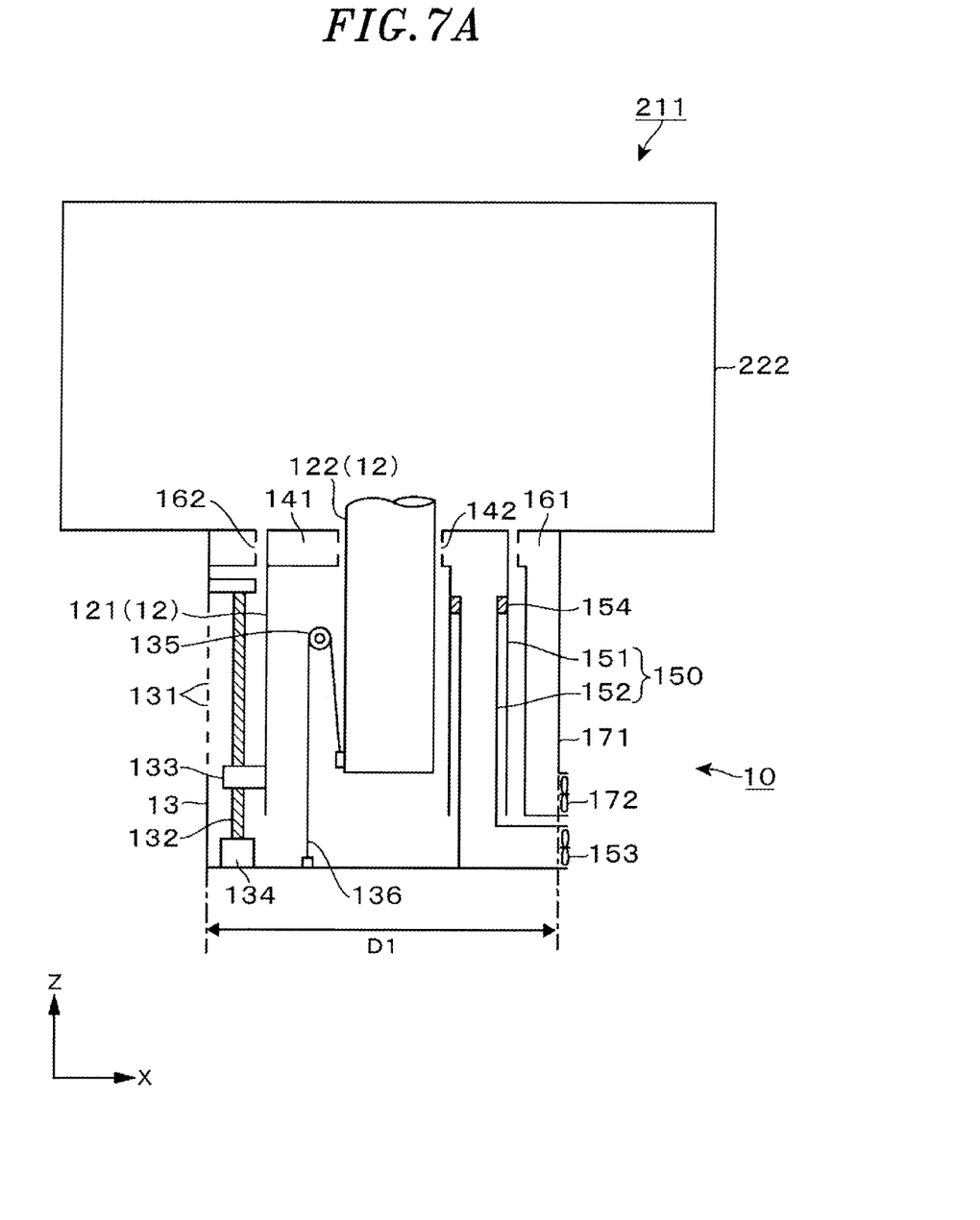
FIG. 7A is a first operational view of the wafer transfer device.
Figure 7B:
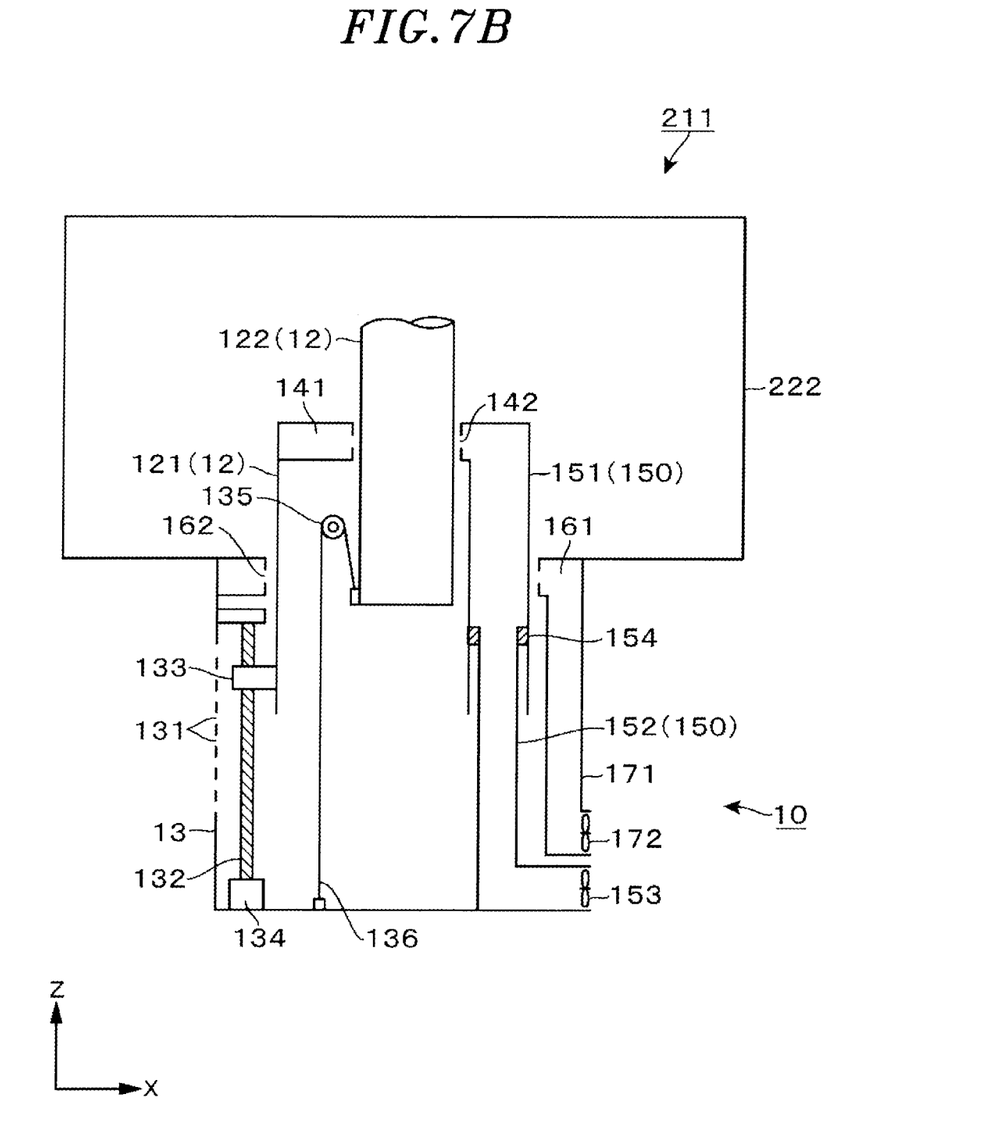
FIG. 7B is a second operational view of the wafer transfer device.

On the other hand, when the second division shaft portion 122 protrudes from an opening 141a in an upper surface of the first division shaft portion 121 and the first division shaft portion 121 protrudes from an opening 161a in an upper surface of the base part 13, the telescopic shaft part 12 is in an extended state (see an external perspective view of FIG. 4 and a longitudinal cross-sectional side view of FIG. 7B).

In this way, the telescopic shaft part 12 may be extended and contracted between the contacted state and the extended state, and thus, as shown in FIGS. 2 and 3, the transfer arm part 11 may freely move upward or downward within a predetermined height range.

In addition, as shown in FIGS. 7A, 7B, and the like, a plurality of ventilation holes 131 are formed in a sidewall surface or a bottom surface of the base part 13 (in the present example, the ventilation holes 131 are formed only in the side wall surface of the base part 13). The ventilation hole 131 forms a gas flow according to a change in internal volume of the base part 13 when the telescopic shaft part 12 is accommodated in the base part 13 and is moved to the outside of the base part 13, thereby serving to suppress an excessive pressure variation in the base part 13.

The above-described extension or contraction operation is performed by moving the first division shaft portion 121 upward or downward from the base part 13 and concurrently moving the second division shaft portion 122 upward or downward from the first division shaft portion 121.

There is no particular limitation on a configuration of a driving mechanism for performing such a movement, and any driving mechanism is usable as long as that can perform the above-described upward or downward movement of each of the first division shaft portion 121 and the second division shaft portion 122.

FIGS. 7A and 7B illustrate an example of a driving mechanism in which a ball screw 132 is provided in the base part 13, and the first division shaft portion 121 is moved upward or downward by being attached to a slider 133 that is moved upward or downward by rotating the ball screw 132 forward or in reverse using a driving motor 134.

In addition, as a driving mechanism for the second division shaft portion 122, a pulley 135 is provided on an inner wall surface of the first division shaft portion 121, one end of a belt 136 wound around the pulley 135 is connected to a floor surface of the base part 13, and the other end thereof is attached to the second division shaft portion 122.

In the above-described driving mechanisms, when the first division shaft portion 121 is moved upward, the belt 136 connected to the floor surface of the base part 13 may be pulled, and thus, the second division shaft portion 122 may be moved upward together with the pulley 135 that is rotated and moved upward (the second division shaft portion 122 is moved upward). When the first division shaft portion 121 is moved downward, through an operation opposite to upward movement, the second division shaft portion 122 is also moved downward.

In this way, inside the base part 13 or the telescopic shaft part 12 in which the mechanical driving mechanisms are accommodated, particles may be generated due to contact between constituent members of the driving mechanisms (contact between the ball screw 132 and the slider 133 and contact between the pulley 135 and the belt 136 in the examples shown in FIGS. 7A and 7B). In addition, the particles can also be generated during other operations, as well as an upward or downward operation of each of the division shaft portions 121 and 122. For example, particles may be generated in the base part 13 or the like by a driving mechanism which performs a rotation operation of the transfer arm part 11. When the particles are introduced into the mini-environment 222 of the atmospheric transfer chamber 211, the particles contaminate the wafer W.

In this regard, the telescopic shaft part 12 of the present example has the telescopic structure in which the second division shaft portion 122 of a tubular shape is accommodated in the first division shaft portion 121 of a tubular shape, and an outer peripheral surface of the second division shaft portion 122 and an inner peripheral surface of the first division shaft portion 121 face each other with a gap therebetween. In addition, an outer peripheral surface of the telescopic shaft part 12 (first division shaft portion 121) and an inner peripheral surface of the opening 161a of the base part 13 also face each other with a gap therebetween.

The gaps may become paths through which particles generated inside the base part 13 or the telescopic shaft part 12 are introduced into the mini-environment 222.

Therefore, we may consider a method in which pressure inside the base part 13 or the telescopic shaft part 12 is maintained to be lower than pressure inside the mini-environment 222, and a part of a downflow formed in the mini-environment 222 flows via the above-described gap thereby suppressing an outflow of particles.

However, in the mini-environment 222 to which the wafer W subjected to predetermined processes by the processing devices 313 to 316 is transferred, residual extraneous materials attached to the wafer W may be sublimated, and thus, components thereof may be included in clean air of a downflow. Some of the sublimated components of the residual extraneous materials react with moisture to generate corrosive materials, and when the corrosive materials are taken into the base part 13 or the telescopic shaft part 12, the corrosive materials cause corrosion of the driving mechanism and other devices.

Based on such issues, the wafer transfer device 10 of the present example can exhaust in a local region between the mini-environment 222 and the inside of the telescopic shaft part 12 and a local region between the mini-environment 222 and the inside of the base part 13. Due to the exhausting element, both of the particles generated in the telescopic shaft part 12 or the base part 13 and the corrosive materials generated in the mini-environment 222 may be discharged to the outside from the mini-environment 222 and the inside of the telescopic shaft part 12 or the base part 13.

Hereinafter, a specific configuration for performing the local exhausting will be described with reference to FIGS. 5 and 6.

Figure 5:
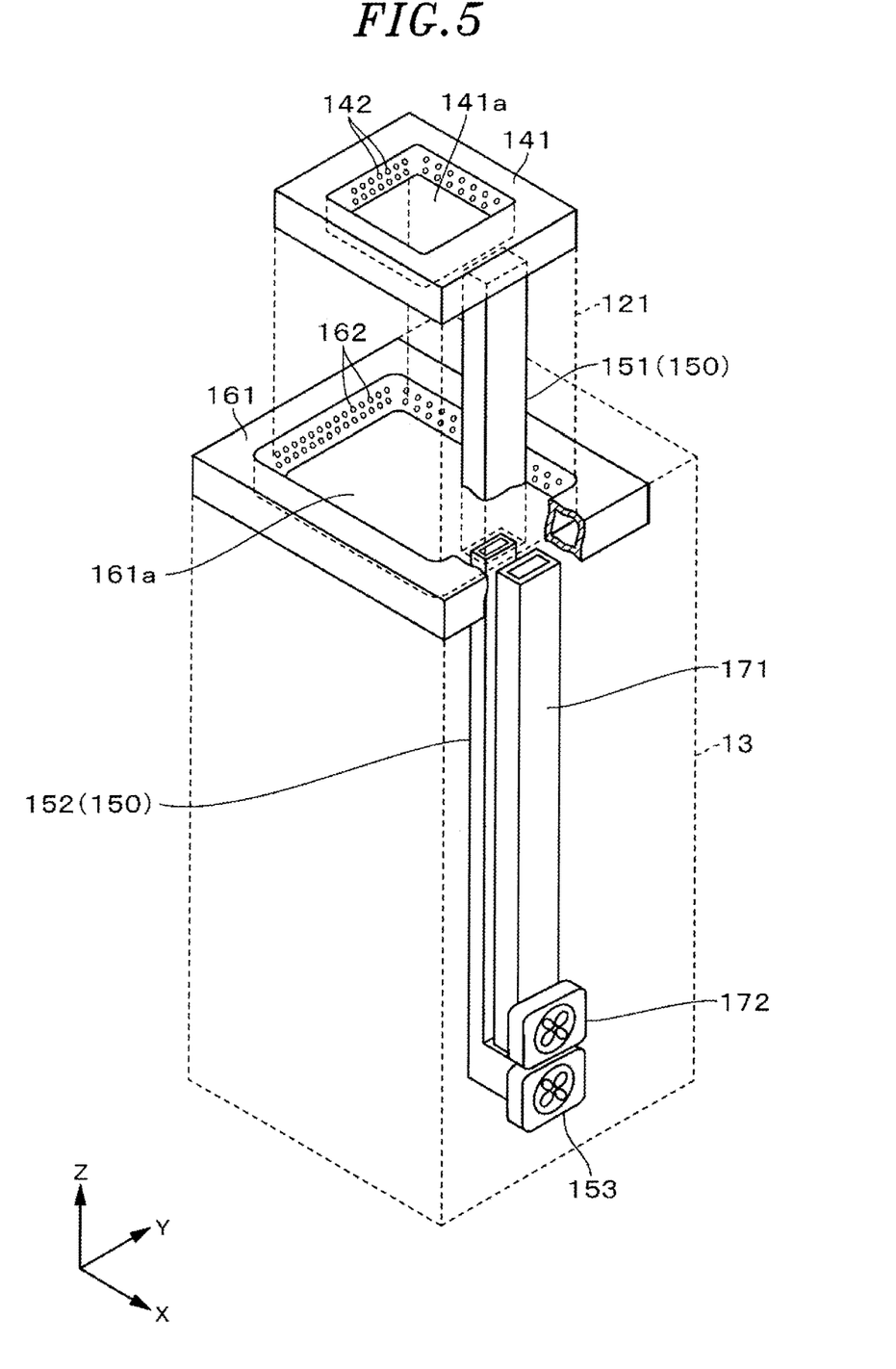
FIG. 5 is a transparent perspective view illustrating the configuration of the lower side of the wafer transfer device.

FIG. 5 is a perspective view illustrating a portion of an internal structure of the base part 13 and the first division shaft portion 121 shown in FIG. 4.

As shown in FIG. 5, an annular channel 141 of an angular ring shape has an opening 141a, the second division shaft portion 122 is inserted into the opening 141a, and the innular channel 141 is provided at an upper end portion of the first division shaft portion 121 of the present example so as to correspond to a cross-sectional planar shape of the first division shaft portion 121. The annular channel 141 constitutes a portion of the first division shaft portion 121 of a tubular shape.

In addition, a base-side annular channel 161 of an angular ring shape has an opening 161a, the telescopic shaft part 12 (first division shaft portion 121) is inserted into the opening 161a, and the baseside annular channel 161 is provided at an upper end portion of the base part 13 so as to correspond to a cross-sectional planar shape of the base part 13. The base-side annular channel 161 constitutes a portion of an upper surface of the base part 13.

As shown in FIGS. 7A and 7B, the annular channel 141 is disposed between the outer peripheral surface of the second division shaft portion 122 and the inner peripheral surface of the first division shaft portion 121 which face each other. In the present example, the annular channel 141 is positioned in an annular shape at the upper end portion of the first division shaft portion 121 along the inner peripheral surface of the first division shaft portion 121.

In addition, as shown in FIGS. 7A and 7B, the base-side annular channel 161 is provided at the upper end portion of the base part 13 along the outer peripheral surface of the telescopic shaft part 12 (first division portion 121) passing through the base part 13.

The wafer transfer device 10 of the present example is configured to perform local exhausting on both an atmosphere inside the telescopic shaft part 12 or the base part 13 and an atmosphere inside the mini-environment 222 by using the annular channel 141 or the base-side annular channel 161.

In the wafer transfer device 10 of the present example, the annular channel 141 and the base-side annular channel 161 have substantially the same configuration except that their sizes are different according to dimensions of the cross-sectional planar surfaces of the telescopic shaft part 12 and the base part 13, and thus, an example of the configuration of the annular channel 141 will be described below.

Figure 6:
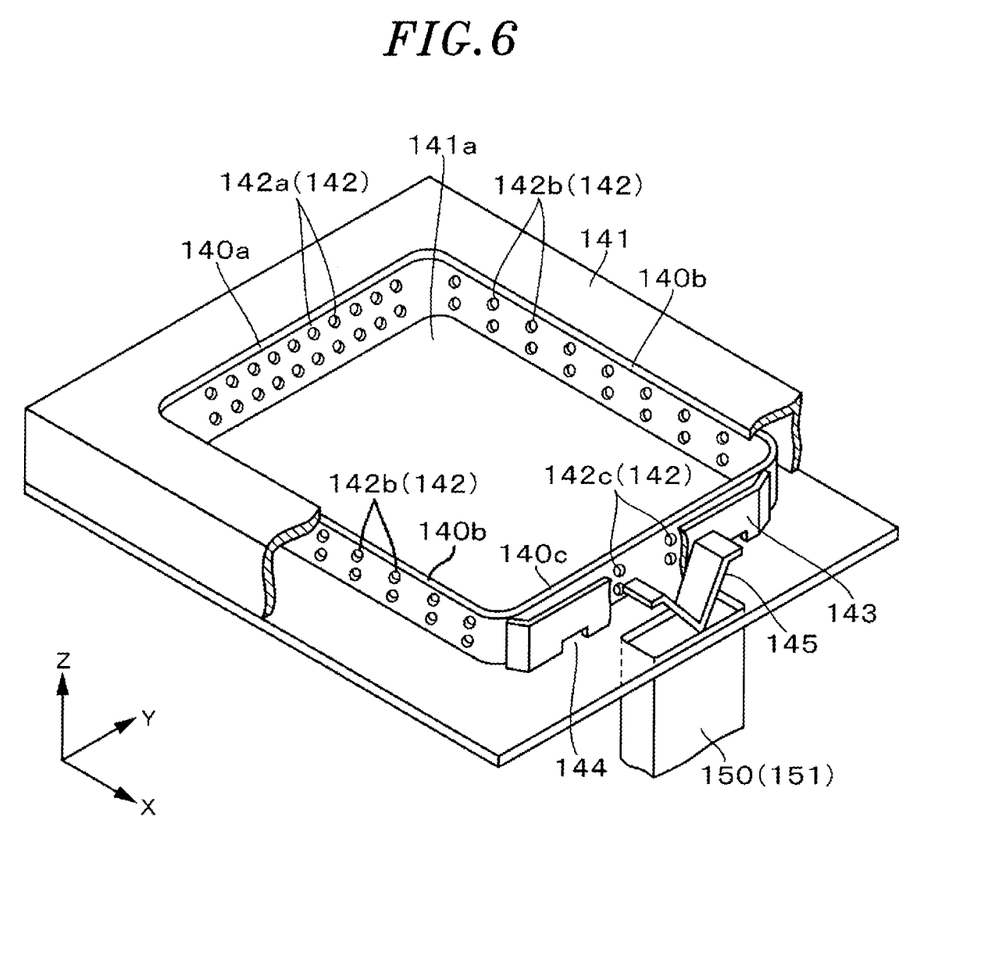
FIG. 6 is a perspective view of an annular channel provided in a telescopic shaft part of the wafer transfer device.

As shown in a partially broken perspective view of FIG. 6, the annular channel 141 of the present example is formed of a channel member having an angular ring shape, and an inner region of a ring is formed as the opening 141a into which the second division shaft portion 122 is inserted. In four sidewall (inner wall) surfaces of the annular channel 141 formed at positions facing the opening 141*a*, a plurality of exhaust holes 142 having a small hole shape are provided in a circumferential direction of the outer peripheral surface (facing surface) of the second division portion 122 inserted into the opening 141*a*.

A gas flowing into the gap between the facing surfaces of the second division shaft portion 122 and the first division shaft portion 121 flows into the annular channel 141 through the exhaust holes 142.

As shown in FIG. 6, an exhaust channel 150 is connected to a bottom surface of the annular channel 141 at a center position of one side of an angular ring. The gas flowing into the annular channel 141 is discharged to the outside through the exhaust channel 150.

As shown in FIGS. 5, 7A, and the like, an exhaust fan 153 is provided at the other end portion of the exhaust channel 150. The exhaust fan 153 is operated to draw a gas from the annular channel 141 and discharge the drawn gas toward an exhaust channel (not shown) outside the wafer transfer device 10. Here, a shape of the exhaust channel 150 is changed as the first division shaft portion 121 moves upward or downward, and a specific configuration therefor will be described below.

As described above, a gas flows into the annular channel 141 from the plurality of exhaust holes 142 dispersed and formed along four inner walls 140*a*, 140*b*, and 140*c*, and the gas is exhausted from the annular channel 141 through the exhaust channel 150 connected to a predetermined position. Due to a difference between a connection position of the exhaust channel 150 and a position of the exhaust holes 142, suctioning intensity of a gas into the annular channel 141 may vary according to the positions of the exhaust holes 142.

Meanwhile, in order to ensure stable local exhaust, uniformly exhausting in a circumferential direction of the gap between the second division shaft portion 122 and the first division shaft portion 121 is preferable. Therefore, the annular channel 141 of the present example has the following configurations so that the annular channel 141 is configured to exhaust a gas at a uniform flow rate in the circumferential direction of the gap (circumferential direction of the annular channel 141).

As a first configuration for performing uniform exhausting in the circumferential direction, the plurality of exhaust holes 142 provided in the annular channel 141 are disposed such that an arrangement interval therebetween is gradually increased toward the connection position of the exhaust channel 150.

That is, as shown in FIG. 6, the exhaust holes 142*a* are formed in the inner wall 140*a* positioned opposite to the connection position of the exhaust channel 150 with the opening 141*a* interposed therebetween, and the arrangement interval between the exhaust holes 142*a* is the narrowest. Next, the exhaust holes 142*b* are formed in the inner walls 140*b* at both left and right sides when viewed from the connection position of the exhaust channel 150, and the arrangement interval between the exhaust holes 142*b* is greater than that of the exhaust holes 142*a*. In addition, the exhaust holes 142*c* are formed in the inner wall 140*c* at a position facing the connection position of the exhaust channel 150, and an arrangement interval between the exhaust holes 142*c* is the widest.

When open areas of the exhaust holes 142*a*, 142*b*, and 142*c* are the same, the arrangement intervals of the exhaust holes 142*a*, 142*b*, and 142*c* can be varied from each other as the number of the exhaust holes 142*a*, 142*b*, and 142*c* disposed per unit area may be changed according to a distance from the connection position of the exhaust channel 150. As a result, the open areas of the exhaust holes 142*a*, 142*b*, and 142*c* per unit area are adjusted, thereby changing pressure loss when a gas passes through the inner walls 140*a*, 140*b*, and 140*c* and performing more uniform exhausting in a circumferential direction of the annular channel 141.

As a second configuration for uniform exhausting in the circumferential direction, distributing plates 143 for adjusting an exhaust rate are provided between the connection position of the exhaust channel 50 and the inner wall 140*c* disposed at the position facing the connection position.

In the annular channel 141 of the present example, the distributing plate 143 of a plate shape is provided to cover almost an entire surface of the inner wall 140*c* facing the connection position when viewed from the connection position of the exhaust channel 150. There is a gap between the distributing plate 143 and the inner wall 140*c*. Through-holes 144 of a slit shape are formed in lower end portions of the distributing plates 143 positioned at both left and right sides when viewed from the connection position.

A gas flowing into the annular channel 141 through the exhaust holes 142*c* formed in the inner wall 140*c* flows through the gap between the inner wall 140*c* and the distributing plate 143, passes through the flow-hole 144, and then reaches the exhaust channel 150. In this case, since the flow hole 144 is a slit having a narrow open area, pressure loss of a channel from the exhaust hole 142*c* to the connection position of the exhaust channel 150 is increased. As a result, it is possible to suppress a gas having an excessive flow rate from flowing from the exhaust hole 142*c* near the connection position of the exhaust channel 150 as compared with other regions, and it is possible to perform more uniform exhausting in the circumferential direction of the annular channel 141.

By using each of the above-described methods, a gas is introduced at an uniform flow rate from the exhaust holes 142 provided at each position in the circumferential direction of the gap (annular channel 141) between the second division shaft portion 122 and the first division shaft portion 121. After the gas flows in the annular channel 141 toward the connection position of the exhaust channel 150, as shown in FIG. 6, the gas is guided by a guide plate 145 disposed above the connection position of the exhaust channel 150 and flows into the exhaust channel 150.

As described above, only one of adjusting the arrangement intervals of the exhaust holes 142*a*, 142*b*, and 142*c*, and a making uniform exhaust in the circumferential direction through the arrangement of the distributing plate 143 may be performed as necessary. In addition, other methods may be combined in which the open areas of the plurality of exhaust holes 142 provided in the annular channel 141 are gradually decreased toward the connection position of the exhaust channel 150.

Furthermore, it is not an essentially required that the exhaust holes 142 are formed as a plurality of small holes. For example, the exhaust hole 142 with a slit shape horizontally extending may be formed to extend along a flow path of the annular channel 141.

As shown in FIGS. 5, 7A, and the like, the annular channel 141 having the above-described configurations is disposed at the upper end portion of the first division shaft portion 121. Therefore, as the first division shaft portion 121 is moved upward or downward due to the extension or contraction of the telescopic shaft part 12, the annular channel 141 is also moved upward or downward. When the exhaust channel 150 has a structure of which a shape is not changed, upward or downward movement of the first division shaft portion 121 including the annular channel 141 is hindered.

Therefore, the exhaust channel 150 of the present example is configured not to hinder the upward or downward movement by way of changing the shape of the exhaust channel 150 as the first division shaft portion 121 is moved upward or downward.

As an example in which the shape of the exhaust channel 150 is changed, the exhaust channel 150 shown in FIGS. 5, 7A, and 7B is provided as a combination of two channel portions (upstream channel portion 151 and downstream channel portion 152). A length of the exhaust channel 150 is changed according to an upward or downward operation of the first division shaft portion 121.

Specifically, the exhaust channel 150 may include a portion (channel portion) installed to vertically extend, and the channel portion may be divided into the upstream channel portion 151 and the downstream channel portion 152. The upstream channel portion 151 and the downstream channel portion 152 may have a telescopic structure to constitute the exhaust channel 150 having a telescopic structure that is extendable and contractible.

In the present example, a pipe diameter of the upstream channel portion 151 is greater than that of the downstream channel portion 152, and an upper end portion of the downstream channel portion 152 is formed to be inserted from an opening in a lower end portion of the upstream channel portion 151. A seal portion 154 is provided at a connection portion between the upstream channel portion 151 and the downstream channel 152 to seal a gap between the upstream channel portion 151 and the downstream channel 152.

The seal portion 154 is made of a resin having a high slipping property or the like. The seal portion 154 does not necessarily need to airtightly seal the gap between the upstream channel portion 151 and the downstream channel portion 152. For example, the seal portion 154 may have a sealing function sufficient to avoid inconvenience of a gas passing through the annular channel 141 being hindered from being exhausted due to a gas escaping through the gap.

As shown in FIG. 5, the base-side annular channel 161 is provided at the upper end portion of the base part 13 in a circumferential direction of a side surface of the telescopic shaft part 12 (first division shaft portion 121) at a position where the telescopic shaft part 12 passes through the base part 13. The base-side annular channel 161 has substantially the same configuration as the annular channel 14 described with reference to FIG. 16, and a gas is exhausted through base-side exhaust holes 162.

A gas flowing into the base-side annular channel 161 is exhausted to the outside through a base-side exhaust channel 171 connected to the base-side annular channel 161. An exhaust fan 172 for drawing a gas from the base-side annular channel 161 is provided at the other end portion of the base-side exhaust channel 171 like the exhaust fan 153 installed on the exhaust channel 150.

On the other hand, since the base part 13 of the present example does not perform upward or downward movement to change a positional relationship between the base-side annular channel 161 and the base-side exhaust channel 171, the base-side exhaust channel 171 does not deform according to movement of another member.

In addition, in an exemplary arrangement of the annular channel 141 and the base-side annular channel 161, like the other portions of the first division shaft portion 121, the annular channel 141 has a size suitable for being accommodated inside the base part 13 through the opening 161a.

In this exemplary arrangement, when the telescopic shaft part 12 is in a contracted state, as shown in FIG. 7A, the annular channel 141 is in a state of being disposed on an inner peripheral side of the base-side annular channel.

The operation of the wafer transfer device 10 having the above-described configuration will be described with reference to FIGS. 7A, 7B, and 8.

First, for example, during a standby period during which the wafer W is not transferred, the wafer transfer device 10 is in a contracted state in which the telescopic shaft part 12 is contracted (FIG. 7A). In this case, the exhaust channel 150 having a telescopic structure is also in a contracted state. Furthermore, even during the period, a downflow may be formed in the mini-environment 222, and local exhausting may be performed by using the annular channel 141 and the base-side annular channel 161.

Next, in order to transfer the wafer W, the telescopic shaft part 12 is moved to a position in an extended state (FIG. 7B), and the wafer W is transferred using the transfer arm part 11. When the first division shaft portion 121 is moved upward and the telescopic shaft part 12 is extended, the upstream channel portion 151 constituting the exhaust channel 150 is also moved upward, and the exhaust channel 150 having a telescopic structure is also in an extended state.

In addition, during such a period, a downflow is formed in the mini-environment 222, and local exhausting is performed by using the annular channel 141 and the base-side annular channel 161.

Figure 8:
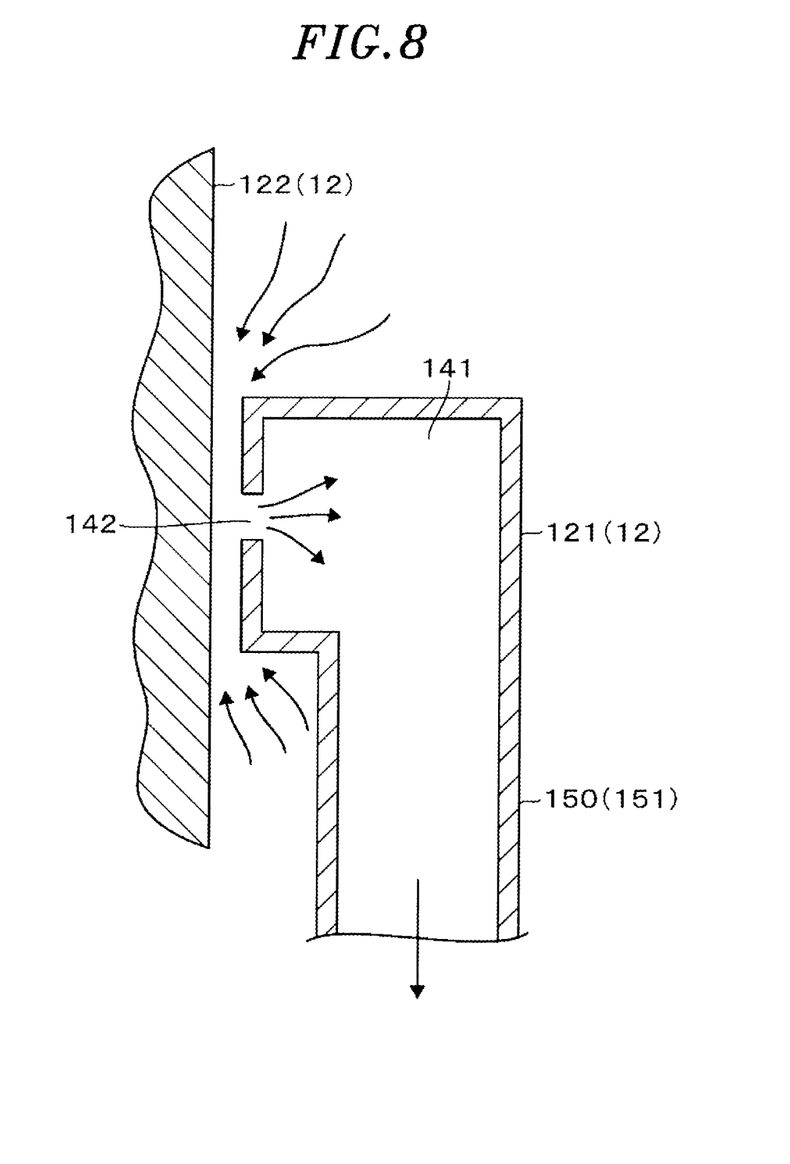
FIG. 8 is an operational view relating to an exhaust using the annular channel.

FIG. 8 is an enlarged longitudinal cross-sectional side view of a region in which the annular channel 141 is disposed. A gas flowing into the gap between the facing surfaces of the second division shaft portion 122 and the first division shaft portion 121 flows into the annular channel 141 through the exhaust holes 142 and is exhausted to the outside through the exhaust channel 150.

In this case, the annular channel 141 is provided in a circumferential direction of the gap and is provided in a local region when viewed in a vertical direction of the division shaft portions 121 and 122. Due to such a configuration, the annular channel 141 discharges both of a gas including particles generated in the telescopic shaft part 12 (first division shaft portion 121) and a gas including corrosive materials generated in the mini-environment 222 to the outside. As a result, it is possible to prevent the gases in the telescopic shaft part 12 and in the mini-environment 222 from being introduced into spaces of the telescopic shaft part 12 and the mini-environment 222 through the gap.

The same operation as that of the example shown in FIG. 8 may be obtained in the base-side annular channel 161. That is, a gas flowing into a gap between facing surfaces of the base part 13 and the second division shaft portion 122 flows into the base-side annular channel 161 through the base-side exhaust holes 162 and is exhausted to the outside through the base-side exhaust channel 171.

In this case, the base-side annular channel 161 is locally provided in a circumferential direction of the gap. Due to such a configuration, the base-side annular channel 161 discharges both of a gas including particles generated in a base part 13 and a gas including corrosive materials generated in the mini-environment 222 to the outside. As a result, it is possible to prevent the gases in the base part 13 and the mini-environment 222 from being introduced into spaces of the base part 13 and the mini-environment 222 through the gap.

According to the wafer transfer device 10 of the present example, it is possible to suppress the outflow/inflow of pollutants (particles and corrosive materials) from the inside to the outside and from the outside to the inside of the wafer transfer device 10 including the telescopic shaft part 12 for elevating the transfer arm part 11. In particular, since the exhaust channel 150 has a configuration of which a shape is changed to be extendable and contractible according to upward or downward movement of the first division shaft portion 121, the annular channel 141 may be provided between the facing surfaces of the first division shaft portion 121 and the second division shaft portion 122 of the telescopic shaft part 12 divided into a plurality of stages. As a result, a restriction on a configuration for a local exhausting by using the annular channel 141 is reduced.

Figure 9A:
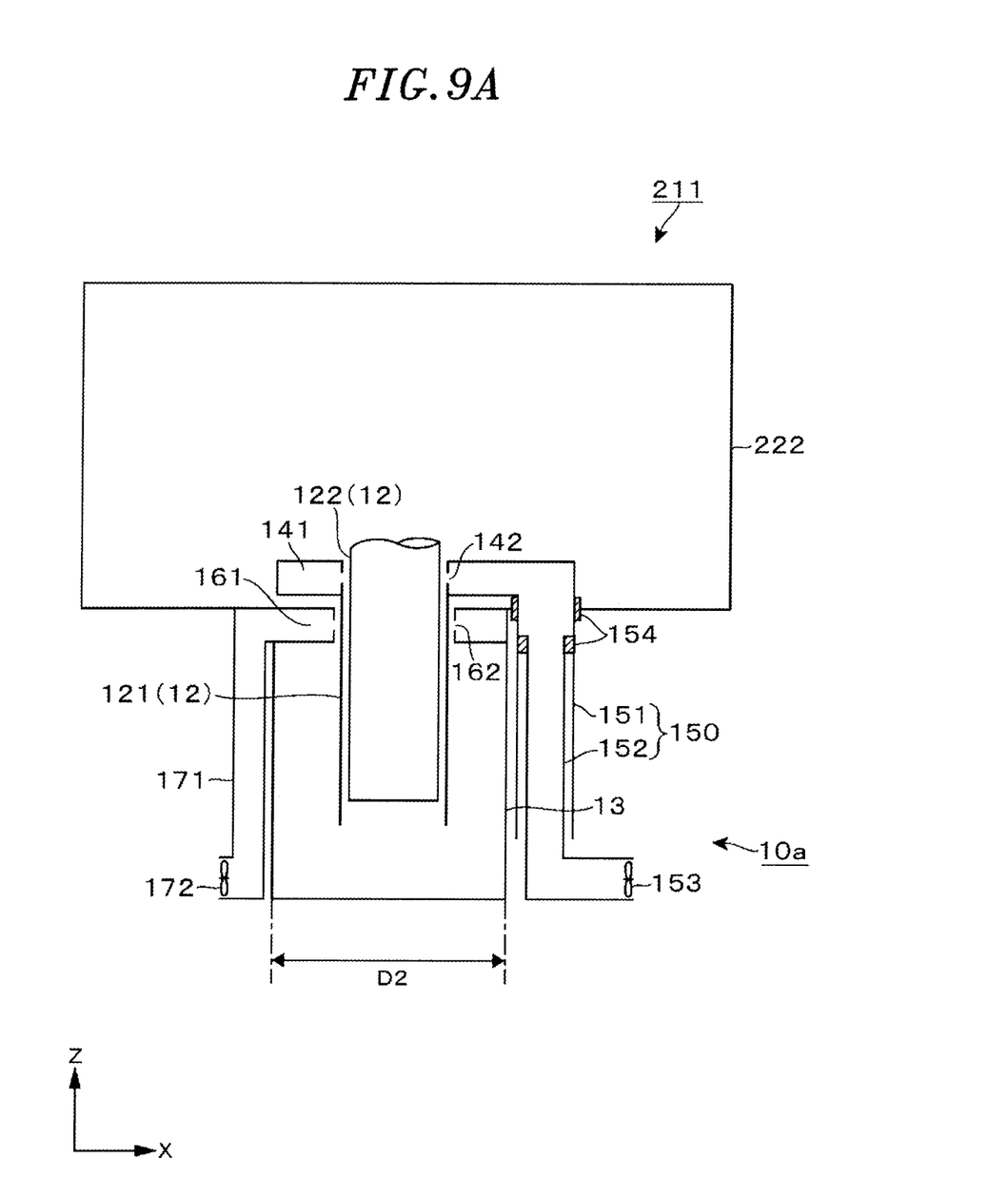
FIG. 9A is a first operational view of a wafer transfer device according to a second embodiment.
Figure 9B:
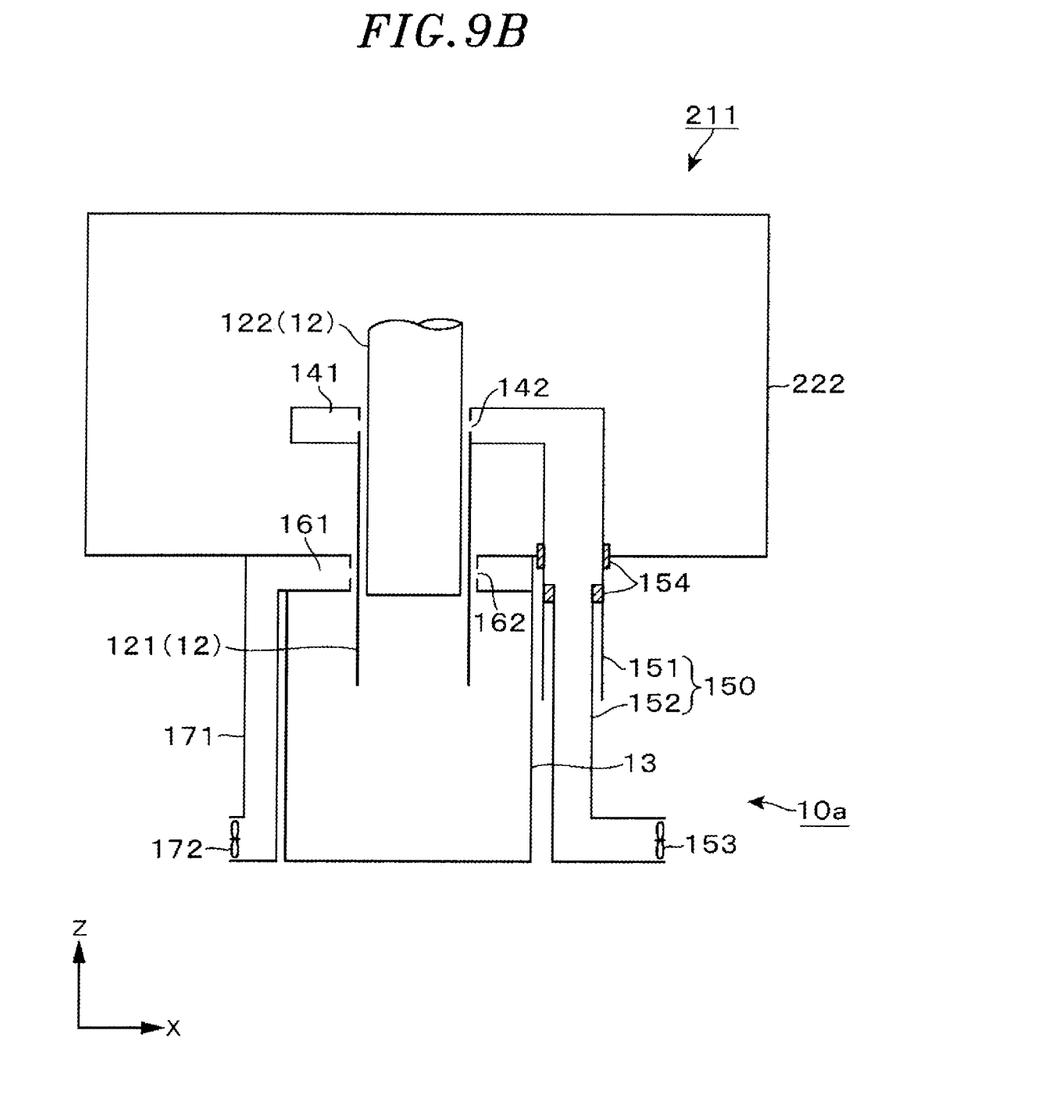
FIG. 9B is a second operational view of the wafer transfer device according to the second embodiment.

Next, a wafer transfer device 10a shown in FIGS. 9A and 9B is a exemplary configuration for reducing an occupied area of a base part 13. In the following description with reference to FIGS. 9A to 10, the components in common with those described with reference to FIGS. 1 to 8 are denoted by the same reference numbers as those used in FIGS. 1 to 8.

In the wafer transfer device 10a shown in FIGS. 9A and 9B, an annular channel 141 is provided to protrude in a flange shape outward from an upper end portion of a first division shaft portion 121. In addition, an opening 161a of a base-side annular channel 161 does not have a size suitable for accommodating the annular channel 141 therein. Due to such a configuration, when a telescopic shaft part 12 is in a contracted state, the annular channel 141 is in a state of being disposed on an upper surface of the base-side annular channel 161.

As described above, the base-side annular channel 161 and the annular channel 141 are vertically stacked and disposed, thereby downsizing the base-side annular channel 161. As a result, for example, a width dimension D2 of the base part 13 may be less than a width dimension D1 of the base part 13 in the wafer transfer device 10 in which the annular channel 141 is disposed on an inner peripheral side of the base-side annular channel 161 shown in FIG. 7A, thereby reducing the occupied area of the base part 13.

In addition, in the wafer transfer device 10a, as shown in FIGS. 9A and 9B, it may be difficult to arrange an exhaust channel 150 inside the first division shaft portion 121. In this case, a configuration is possible in which the exhaust channel 150 is guided to pass through a floor surface of a mini-environment 222, and a seal portion 154 is provided at such a through-position.

Furthermore, in FIGS. 9A and 9B, for convenience of illustration, an example is shown in which the exhaust channel 150 and a base-side exhaust channel 171 are disposed at positions facing each other with the base part 13 interposed therebetween, but the actual arrangement of each of the channels 150 and 171 is not limited to the example.

In the example shown in FIG. 7A, 9A, etc., a telescopic structure is shown in which the telescopic shaft part 12 is accommodated in the base part 13, and even in a structure of the telescopic shaft part 12, a second division shaft portion 122 is accommodated in the first division shaft portion 121.

Figure 10:
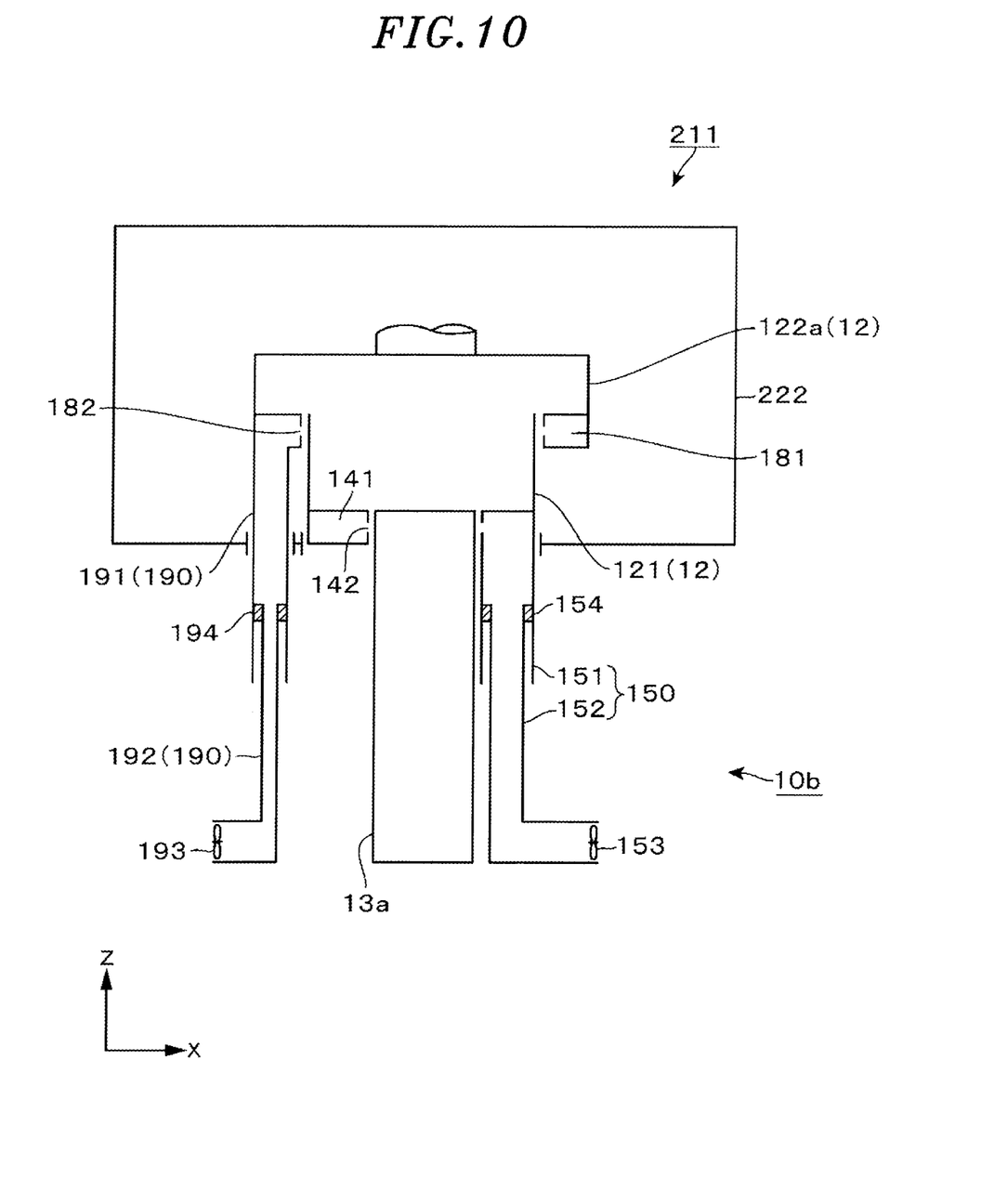
FIG. 10 is an operational view of a wafer transfer device according to a modified embodiment.

In this regard, a wafer transfer device 10b shown in FIG. 10 includes a telescopic shaft part 12 having a telescopic structure such that a first division shaft portion 121 is accommodated inside a second division shaft portion 122a disposed at the uppermost position. In addition, a base part 13a has a configuration accommodated inside the first division shaft portion 121.

In this case, an annular channel 181 is provided at a lower end portion of the second division shaft portion 122a, and a gas introduced into a gap between facing surfaces of the second division shaft portion 122a and the first division shaft portion 121 flows into the annular channel 181 through exhaust holes 182 and is exhausted from an exhaust channel 190 connected to the annular channel 181. Even in the example, the exhaust channel 190 has a telescopic structure including an upstream channel portion 191 and a downstream channel portion 192 and is extendable and contractible according to upward or downward movement of the second division shaft portion 122a. Reference number 193 in FIG. 10 denotes an exhaust fan, and reference number 194 denotes a seal portion, which is the same as the above-described example of the exhaust channel 150.

In addition, an annular channel 141 is provided at a lower end portion of the first division shaft portion 121, and a gas introduced into a gap between facing surfaces of the first division shaft portion 121 and the base part 13a flows into the annular channel 141 through exhaust holes 142 and is exhausted from an exhaust channel 150 connected to the annular channel 141. Even in this case, the exhaust channel 150 has a telescopic structure that is expandable and contractible as described above.

Here, the configurations of the exhaust channels 150 and 190 deformed according to upward or downward movement of the first division shaft portion 121 and the second division shaft portion 122 (122a) are not limited to a case in which a telescopic structure is used. When an upward or downward movement distance of the first division shaft portion 121 and the second division shaft portion 122 (122a) is not so long, a stretchable bellows hose may be used. In addition, when there is a sufficient arrangement space in the base part 13, a configuration is possible in which a flexible hose is disposed and is extended and bent according to upward or downward movement of the first division shaft portion 121 and the second division shaft portion 122 (122a).

The telescopic shaft part 12 is not limited to a case in which the telescopic shaft part 12 is divided into the two stages shown in FIGS. 3 and 4, and the telescopic shaft part 12 may be divided into three or more stages. Even in this case, the above-described local exhausting may be performed by providing the annular channel 141 in any one of the one division shaft portion 121 and the other division shaft portion 122 which have facing surfaces facing each other.

Furthermore, regarding the configuration of the annular channel 141 or the base-side annular channel 161, a plurality of channels partitioned from each other are disposed in an annular shape, and the exhaust channel 150 or the base-side exhaust channel 171 may be connected to each of the channels.

While various embodiments have been described above, the embodiments of the present disclosure are illustrative in all respects and are not restrictive. Further, the above-described embodiments may be omitted, replaced, or changed in various forms without departing from the scope of the appended claims and the gist thereof

What is claimed is:

1. A device for transferring a substrate under air pressure, the device comprising:
   a base part;
   a transfer arm part configured to transfer a substrate;
   a telescopic shaft part which is provided between the base part and the transfer arm part, and divided into a plurality of division shaft parts having a tubular shape, wherein the division shaft parts have a telescopic structure that is extendable and contractible;

an annular channel which is provided in a circumference of a surface of a division shaft parts, wherein the surface of the division shaft part faces a surface of other division shaft part due to the telescopic structure, the annular channel has exhaust holes, and the annular channel exhausts a gas flowing into a gap formed in the circumferential direction between the facing surfaces; and an exhaust channel which is connected to the annular channel so as to exhaust the gas flowing into the annular channel, wherein a shape of the exhaust channel is changed according to upward or downward movement of the division shaft part due to extension or contraction of the telescopic shaft part.

2. The device of claim 1, wherein the exhaust channel includes a channel part that extends vertically, wherein the channel part is divided into a plurality of channel parts, wherein an upstream channel part and a downstream channel part are connected to constitute a telescopic structure, and wherein the exhaust channel extends or contracts as the upstream channel part is moved upward or downward according to the upward or downward movement of the division shaft portion.

3. The device of claim 2, wherein a seal portion is provided at a connection portion between the upstream channel portion and the downstream channel part to seal a gap between the upstream channel part and the downstream channel part.

4. The device of claim 1, wherein the plurality of exhaust holes are formed in the annular channel, and the plurality of exhaust holes are disposed such that an arrangement interval therebetween is gradually increased toward a connection position of the exhaust channel.

5. The device of claim 2, wherein the plurality of exhaust holes are formed in the annular channel, and the plurality of exhaust holes are disposed such that an arrangement interval therebetween is gradually increased toward a connection position of the exhaust channel.

6. The device of claim 1, further comprising a distributing plate for adjusting an exhaust rate, wherein the distributing plate is provided between a connection position of the exhaust channel and the exhaust holes facing the connection position.

7. The device of claim 2, further comprising a distributing plate for adjusting an exhaust rate, wherein the distributing plate is provided between a connection position of the exhaust channel and the exhaust holes facing the connection position.

8. The device of claim 1, further comprising:

a base-side annular channel, wherein when the telescopic shaft part is provided to pass through the base part, the base-side annular channel is provided as an annular shape in a circumferential direction of a side surface of the telescopic shaft part passing through the base part, and the base-side annular channel has base-side exhaust holes formed in the circumferential direction; and a base-side exhaust channel connected to the base-side annular channel so as to exhaust the gas flowing into the base-side annular channel.

9. The device of claim 2, further comprising:

a base-side annular channel, wherein when the telescopic shaft part is provided to pass through the base part, the base-side annular channel is provided as an annular shape in a circumferential direction of a side surface of the telescopic shaft part passing through the base part, and the base-side annular channel has base-side exhaust holes formed in the circumferential direction; and a base-side exhaust channel connected to the base-side annular channel so as to exhaust the gas flowing into the base-side annular channel.

10. The device of claim 8, wherein, when the telescopic shaft part is contracted, the annular channel is disposed on an inner peripheral side of the base-side annular channel.

11. The device of claim 9, wherein, when the telescopic shaft part is contracted, the annular channel is disposed on an inner peripheral side of the base-side annular channel.

12. The device of claim 8, wherein, when the telescopic shaft part is contracted, the annular channel is disposed on an upper surface of the base-side annular channel.

13. The device of claim 9, wherein, when the telescopic shaft part is contracted, the annular channel is disposed on an upper surface of the base-side annular channel.

14. A system for processing a substrate, the system comprising:

the device of claim 1; and a substrate processing apparatus configured to process a substrate transferred through the device.

15. A method of transferring a substrate in an air pressure, the method comprising:

exhausting a gas flowing into a gap between facing surfaces of division shaft parts using an annular channel that is a channel provided in a telescopic shaft part, wherein the telescopic shaft part is provided between a base part and a transfer arm part configured to transfer a substrate and is divided into the plurality of division shaft parts having a tubular shape and in which the division shaft parts are provided in a telescopic structure that is extendable and contractible, and wherein the annular channel is provided in a circumference of a surface of a division shaft parts, wherein the surface of the division shaft part faces a surface of other division shaft part due to the telescopic structure, the annular channel has exhaust holes formed in the circumferential direction; and exhausting the gas flowing into the annular channel using an exhaust channel which is connected to the annular channel, wherein a shape of the exhaust channel is changed according to upward or downward movement of the division shaft part due to extension or contraction of the telescopic shaft part.

* * * * *